United States Patent
Wellerdieck et al.

(10) Patent No.: US 6,248,219 B1
(45) Date of Patent: *Jun. 19, 2001

(54) PROCESS AND APPARATUS FOR SPUTTER ETCHING OR SPUTTER COATING

(75) Inventors: Klaus Wellerdieck, Buchs; Urs Wegmann, Oberschan; Karl Hoefler, Buchs, all of (CH)

(73) Assignee: Unaxis Balzers Aktiengesellschaft, Fuerstentum (LI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/418,256

(22) Filed: Apr. 6, 1995

Related U.S. Application Data

(63) Continuation of application No. 08/250,093, filed on May 26, 1994, now abandoned, which is a continuation of application No. 08/033,142, filed on Mar. 16, 1993, now abandoned, which is a continuation-in-part of application No. 07/829,739, filed on Jan. 31, 1992, now abandoned, which is a continuation of application No. 07/579,068, filed on Sep. 6, 1990, now abandoned, which is a continuation of application No. 07/047,896, filed on May 7, 1987, now abandoned.

(30) Foreign Application Priority Data

Jun. 23, 1986 (CH) .................................................. 2516/86

(51) Int. Cl.$^7$ .................................................. C23C 14/34

(52) U.S. Cl. ................................ 204/192.12; 204/192.32; 204/298.31; 204/298.16; 204/298.37

(58) Field of Search ......................... 204/298.31, 298.34, 204/298.37, 298.38, 298.08, 298.14, 298.16, 298.19, 192.1, 192.12, 192.2, 192.32; 156/345

(56) References Cited

U.S. PATENT DOCUMENTS 3,661,761 * 5/1972 Koenig ......................... 204/192.12 X
4,278,528 * 7/1981 Kuehnle et al. ............. 204/298.24 X (List continued on next page.)

OTHER PUBLICATIONS

Chris Horwitz, "RF sputtering–voltage division between electrodes", J. Vac. Sci. Technol. A, 1(1), Jan.–Mar. 1983, pp. 60–68.*

Primary Examiner—Nam Nguyen
Assistant Examiner—Gregg Cantelmo
(74) Attorney, Agent, or Firm—Evenson, McKeown, Edwards & Lenahan, P.L.L.C.

(57) ABSTRACT

A problem which occurs in the sputtering of a substance by means of a high-frequency discharge between two electrodes, is that both electrode surfaces are sputtered away when the electrode surface that is actually not to be sputtered is not at least ten times as large as the surface of the electrode carrying the substance. To prevent an undesirable cosputtering, in on embodiment, a vacuum recipient at a selected gas pressure has first and a second electrodes which are selected so that their surface areas form a ratio $R_{A\,12}$ such that $0.3 \leq R_{A12} \leq 3$. A discharge space in the vacuum recipient is confined to the electrode surfaces. An RF plasma discharge is generated in the discharge space by applying an electric RF field between the electrode surface, so that a first dark space region with a first drop of time-averaged electric potential and a second dark space region with a second drop of time-averaged electric potential, are respectively provided adjacent each electrode. The surface of an object to be coated is disposed in the second dark space region adjacent said larger electrode surface so that the surface of the object is at a floating electric potential to perform diode sputtering. A magnetic field is generated within the discharge space, a large part of its lines of force being tunnel-like shaped on the first electrode surface and extending across aid first dark space region to enhance sputtering of the surface of the object.

25 Claims, 8 Drawing Sheets

U.S. PATENT DOCUMENTS

| | | | | |
|---|---|---|---|---|
| 4,395,323 | * | 7/1983 | Denton et al. | 204/298.19 |
| 4,508,612 | * | 4/1985 | Blackwell et al. | 204/298.19 X |
| 4,572,759 | * | 2/1986 | Benzing | 204/298.37 X |
| 4,632,719 | * | 12/1986 | Chow et al. | 204/298.37 X |
| 4,657,619 | * | 4/1987 | O'Donnell | 204/298.37 X |
| 4,871,433 | * | 10/1989 | Wagner et al. | 204/298.37 X |
| 4,983,253 | * | 1/1991 | Wolfe et al. | 204/298.37 X |
| 5,113,790 | * | 5/1992 | Geisler et al. | 204/298.37 X |

* cited by examiner

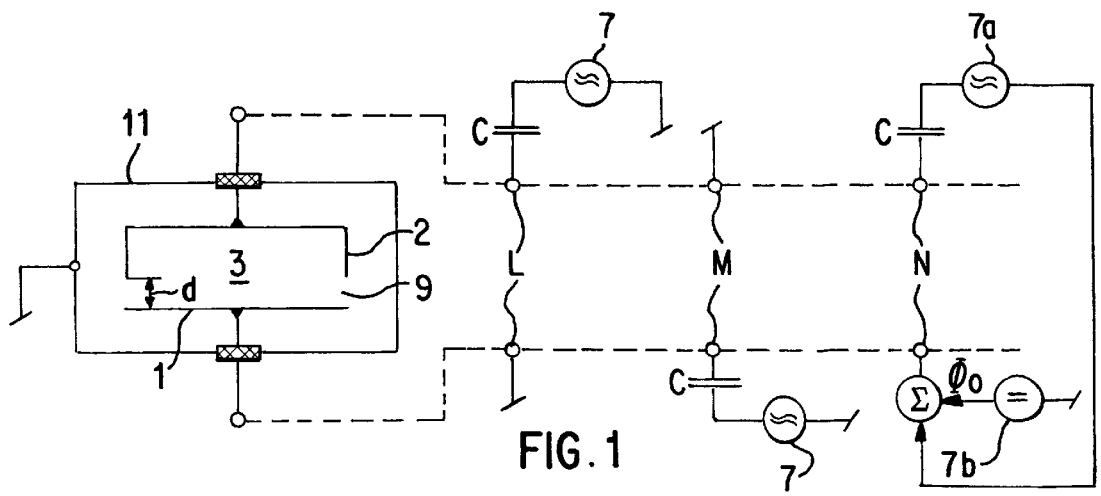
FIG. 1
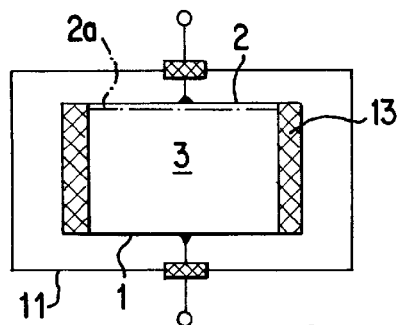
FIG. 2a
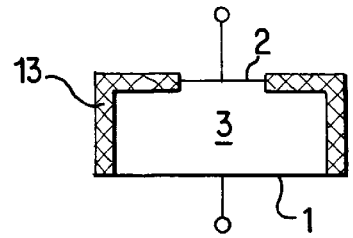
FIG. 2b
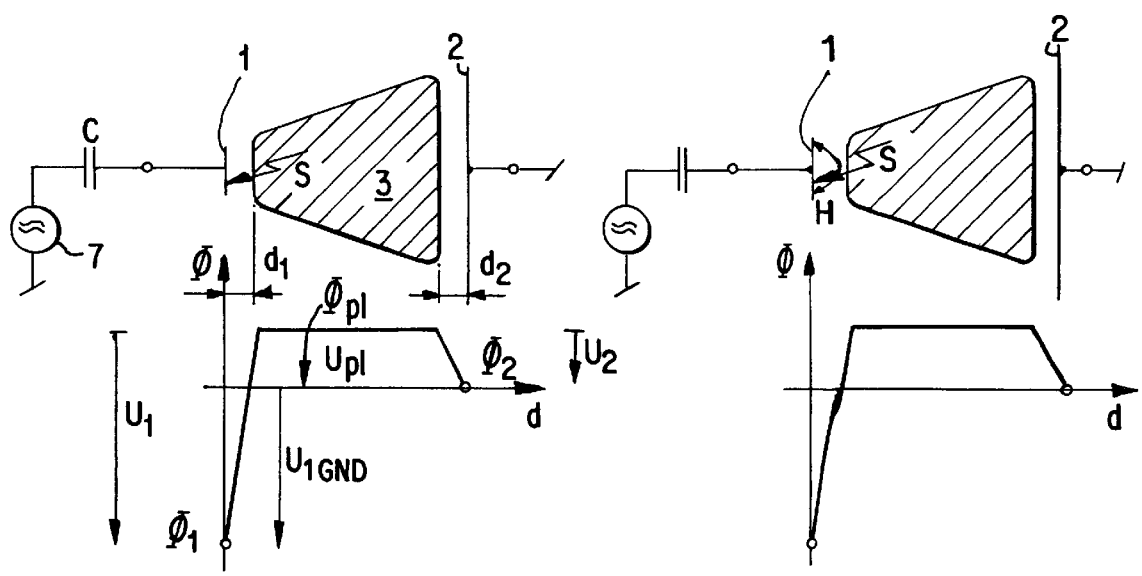
FIG. 3a_PA    FIG. 3a'_PA

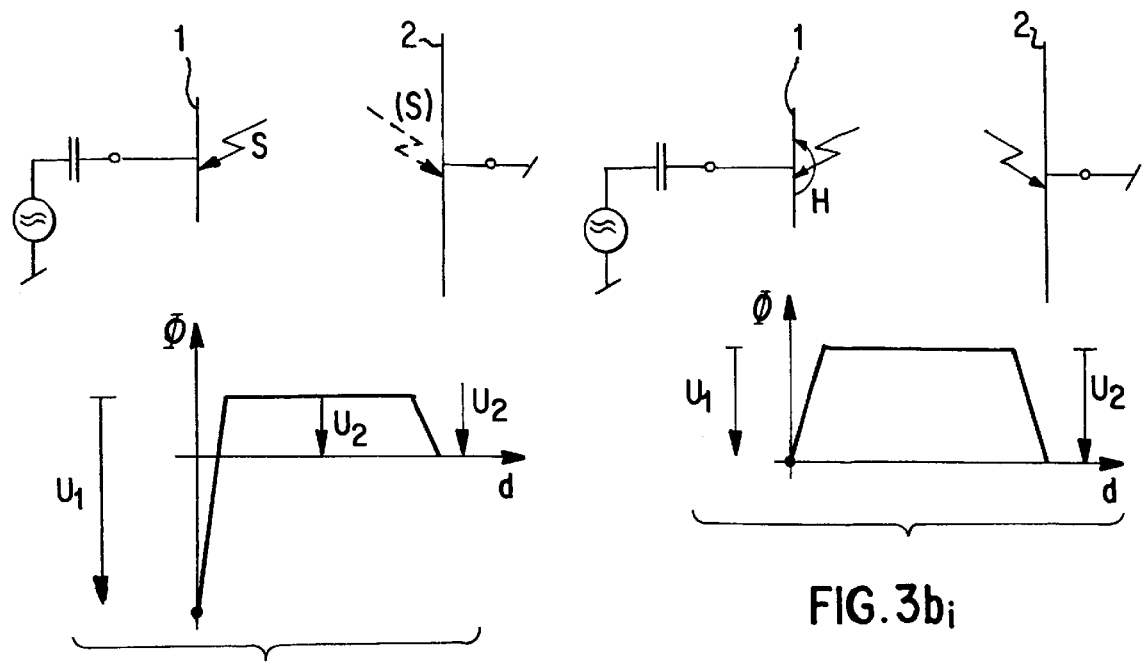
FIG. 3b_PA
FIG. 3b_i
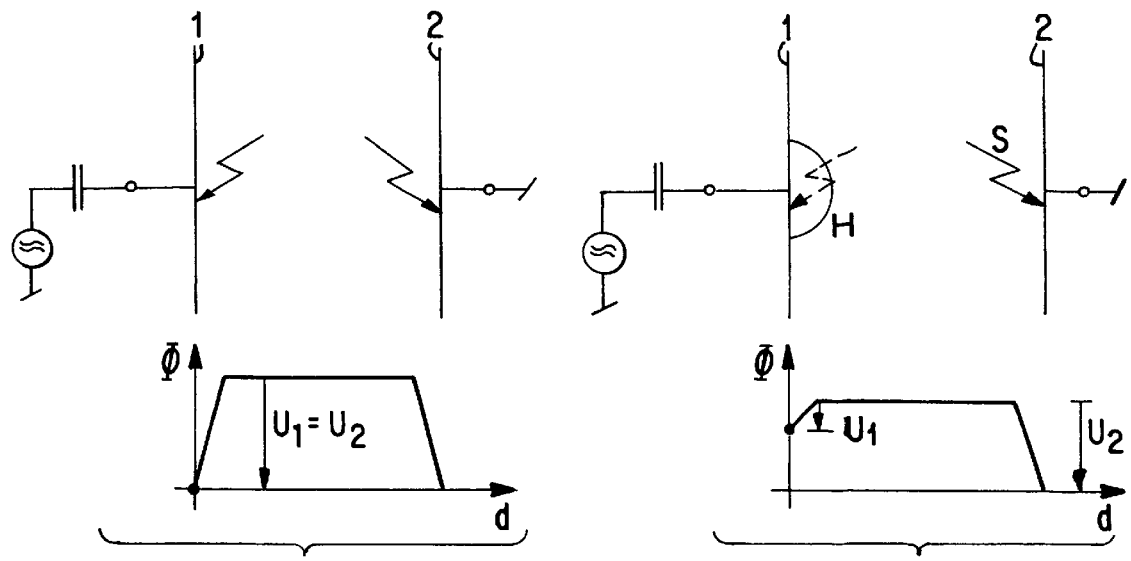
FIG. 3c_PA
FIG. 3c_i

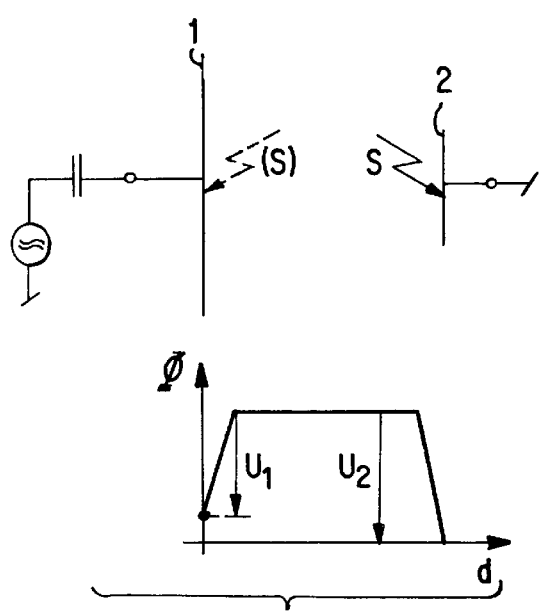
FIG. 3d$_{PA}$
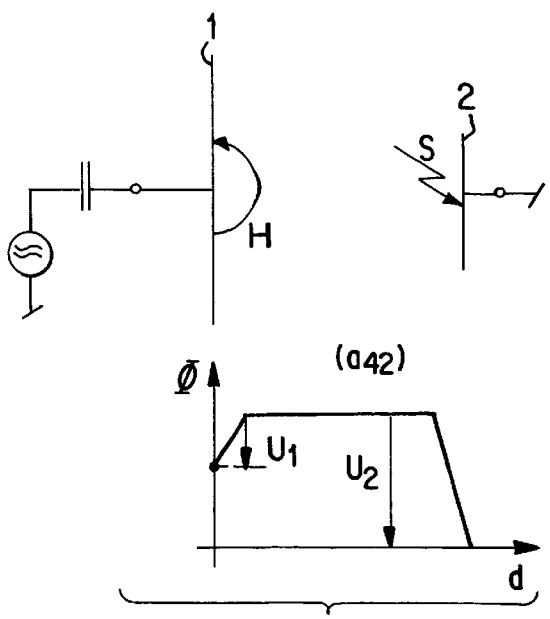
FIG. 3d$_i$
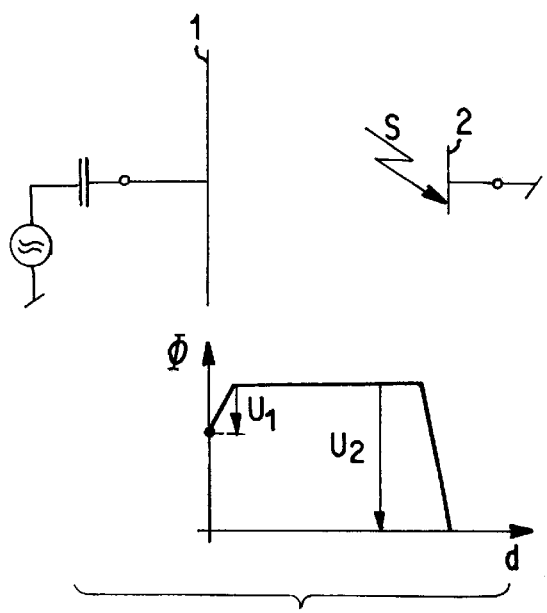
FIG. 3e$_{PA}$
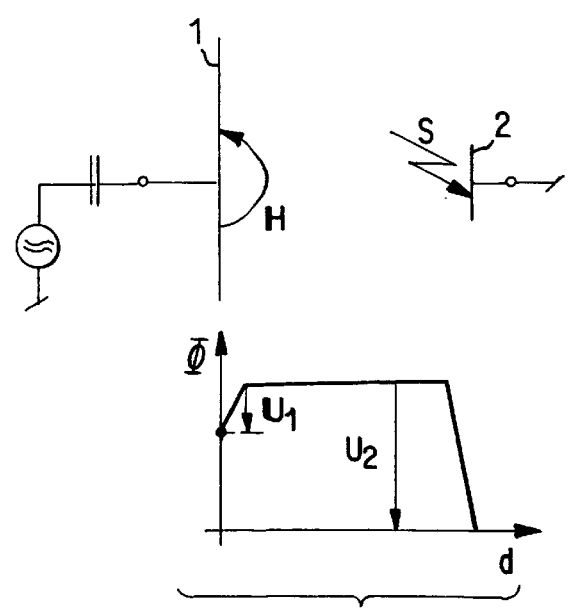
FIG. 3e'$_{PA}$

PROCESS AND APPARATUS FOR SPUTTER ETCHING OR SPUTTER COATING

This is a continuation of application Ser. No. 08/250,093, filed May 26, 1994 now abandoned, which is a continuation of Ser. No. 08/033,142, filed Mar. 16, 1993 now abandoned, which is a continuation-in-part of Ser. No. 07/829,739, filed Jan. 31, 1992 now abandoned, which is a continuation of Ser. No. 07/579,068, filed Sep. 6, 1990 now abandoned, which is a continuation of Ser. No. 07/047,896, filed May 7, 1987 now abandoned.

BACKGROUND OF THE INVENTION

1. Field of the Invention

The present invention is directed to a process and apparatus for sputtering a surface of a workpiece to be sputter-etched or for sputtering a surface of a target for sputter-coating a workpiece, both referred to as a "sputtering object".

More specifically, the present invention is directed to such processes and apparatus, whereat RF sputtering is performed in a vacuum recipient which is filled with a working gas at a selected gas pressure.

Even more specifically, the present invention is directed to the application of magnetic fields in such processes and apparatus.

2. Description of Prior Art

In specific art mentioned above, the law of KOENIG as disclosed for instance in H. R. Koenig and L. I. Meissel, IBM Journal Research Development 14, p. 168 (1970), and H. R. Koenig, U.S. Pat. No. 3,661,761 (1969), is well-known. It defines that the ratio of drop of time-averaged electric potential adjacent to electrode surfaces between which an RF plasma discharge is generated, is given by the inverse ratio of respective electrode surface areas raised to the fourth power. This law is only valid under specific conditions:

The discharge space of the RF plasma discharge is confined by only two electrode surfaces between which RF energy is applied. No further electrode surface is exposed to the plasma which is loaded with an RF current. The confinement of the RF plasma discharge space by the two electrode surfaces whereat RF energy is applied may only have gaps or holes which are of such small extent that the plasma discharge may not spread out of the confinement and couple RF currents to other parts of a vacuum chamber. This means e.g. that the minimal diameter of any gaps in such a two electrode confinement must substantially be not larger than the dark space distance at the working gas pressure maintained during RF plasma discharge. Further spacings between the two electrodes may e.g. be bridged by dielectric material which also prevents spreading of the discharge.

If a sputtering object or a workpiece to be sputter-coated is disposed within the confined discharge space, the said condition is further fulfilled only if the sputtering object is either electrically floating or is disposed on the electric potential of one of the two electrode surfaces to which RF energy is applied.

If these conditions are taken in consideration and RF energy is applied at a frequency of above 3 MHz and below about 90 MHz, then the KOENIG law mentioned above will at least approximately be fulfilled.

In a strongly simplified consideration, positive ions out of the RF plasma discharge are accelerated to the respective electrode surfaces at a kinetic energy predominantly given by the drop of time-averaged electric potential adjacent the electrode surface considered. Depending on the material to be sputtered and the kind of ions and thus of the working gas, sputtering starts at a given ion accelerating drop of time-averaged electric potential adjacent an electrode surface considered.

The "sputtering rate" defined as mass of material sputtered off a surface per time unit depends predominantly upon two largely independent entities:
 a) the average kinetic energy of the positive ions, given by the said drop of time-averaged electric potential across a dark space region,
 b) "plasma density" in such dark space region given by the density of electrically charged particles in said space.

The sputtering rate may be increased by increasing the average kinetic energy of ions and/or by increasing the number of ions impinging on the surface to be sputtered. Thereby increasing of the plasma density will only then increase the sputter rate if the average energy of the ions suffices for sputtering at all.

The law of KOENIG only considers the ratio of averaged kinetic energies in relation to ratio of electrode surfaces at homogenous plasma density.

It thus becomes evident that according to the law of KOENIG, when the two electrode surfaces are equal, both these electrode surfaces will be subjected to sputtering at equal kinetic energy, because in the adjacent dark spaces of both electrodes equal drops of time-averaged electric potential will occur. If one of the two electrodes is made smaller than the other, this will result in an increased ion accelerating drop of time-averaged electric potential adjacent the smaller electrode surface and across its dark space and, accordingly, to diminution of such ion accelerating drop adjacent the larger electrode surface and across its dark space region.

As was mentioned, this phenomenon is known to prevail if the conditions mentioned above are considered.

From a DC plasma sputtering technique, wherein an electric DC field is applied between two electrode surfaces, it is known to provide on one of the two electrode surfaces to be sputtered, here clearly the cathode, a tunnel-shaped magnetic field to improve plasma density adjacent the cathode by the well-known electron trapping effect of magnetic force lines aligned perpendicularly to the electric force lines.

Several successful approaches have become known to apply an e.g. so-called magnetron technique, known from DC sputtering technique, also to RF sputtering techniques, with the object of, as in the DC sputtering case, improving the sputter rate by rising plasma density adjacent the surface to be sputtered. For simultaneously improving sputtering homogenity along a surface to be sputtered, it further became known to provide a relative movement between an applied magnetic field pattern and the surface to be sputtered.

The present invention, as will be described below, is based on a new recognition made by the inventors at systems for which the law of KOENIG is principally valid and which, thus, fulfil the above mentioned conditions by inventively applying specific magnetic fields: It becomes possible to realize average kinetic energy of the ions impinging upon the electrode surfaces which are in opposition to those predicted by the KOENIG law. This inventively recognized deviation of the distribution of the said energy at the two electrode surfaces from that predicted by KOENIG is especially pronounced at electrode surfaces which are of the same order of extent.

From the U.S. Pat. No. 4,278,528 patent (Kuehnle) it is known to provide in an extended vacuum chamber a multitude of targets to be sputtered by RF plasma discharge. Between the multitude of targets and a workpiece band to be continuously sputter-coated a mask in a form of a metallic and grounded plate with respective slits is provided, and provides for sputter-coating a specific line pattern on the moving workpiece band. The RF plasma discharge spaces are formed between respective targets and "anode" electrodes, whereby the RF plasma may spread laterally outwards along the surfaces of the targets. This is because the targets and "anodes" do not confine the respective discharge spaces laterally. Thus, the plasma discharge spaces are primarily confined or bordered by the overall vacuum chamber wall, targets and counter-electrodes named "anodes". Tunnel-shaped magnetic fields are applied either on the target or, opposite to the target, to the "anode" electrode surfaces, so as to prevent electrons from heating the workpiece band which may consist of paper or plastic material.

If this arrangement is considered under the law of KOENIG, then it must be considered that the discharge space is confined on one hand by the target electrode surfaces and, on the other hand, by the "anode"electrode surfaces plus all metallic surfaces exposed to the inside of the overall vacuum chamber. As was mentioned above, the law of KOENIG is further only valid if the discharge is bordered by surfaces on only the two electrode potentials respectively externally applied and on no third potential externally applied and the discharge is thus generated in a so-called "diode arrangement".

In the above mentioned U.S. Pat. No. 4,278,528 patent the diode arrangement condition is only fulfilled if the wall of the overall chamber is at the same electric potential as the biased counter-electrodes (so-called "anodes").

If under these conditions—confinement and diode operation—this known arrangement is considered under the law of KOENIG, it is evident that the electrode surfaces formed by all metallic surfaces exposed to the inside of the vacuum chamber must be considered as one electrode surface and are extremely larger than the "cathode" surfaces of the targets. Thus, according to the said KOENIG law, the "cathode" surfaces will be exclusively sputtered and all the counter-electrode surfaces will not be sputtered, because, there, kinetic ion energy is not sufficient. There is a big difference in the surface areas of the surfaces to be considered as electrode surfaces. The sputtering/non-sputtering energy distribution is thus purely governed by the law of KOENIG and the magnetic fields applied will not affect this distribution. These magnetic fields may increase the plasma density at the targets and thereby sputter rate, i.e. at that electrode at which the average ion energy suffices for sputtering anyhow.

U.S. Pat. No. 4,572,759 patent (Benzing) discloses an RF sputtering arrangement which comprises a pair of coaxial cylindrical electrodes. Electrically isolated from the outer cylindrical electrode, further a wafer carrier electrode is provided. For sputter-etching a wafer on the third electrode, electrical RF potential is applied between the wafer carrier electrode and the central cylindrical electrode, and the second electrode, formed by the outer cylinder, which is disposed at ground potential. There is, thus, formed a triode sputtering arrangement, in that the RF plasma discharge is confined by two electrodes mutually disposed on RF potential and one further electrode disposed at ground potential is also loaded by RF current. In such a triode arrangement, the law of KOENIG may not be applied, as the distribution of the energy of ions impinging on the three electrodes is largely influenced by potentials applied to the three electrodes.

U.S. Pat. No. 4,657,619 patent (O'Donnell) discloses a sputtering apparatus which may be operated in a diode operating mode: For sputter-etching a workpiece, it is disposed on a workpiece carrier electrode within a vacuum recipient and fed with RF energy. The metallic wall of the vacuum chamber is apparently ground potential so that this arrangement in this possible operating mode acts as diode RF sputtering apparatus.

As the entire inner surface of the wall of the vacuum chamber acts as one of the two electrodes confining the RF discharge space and defines an electrode surface area which is much larger than the surface of the workpiece carrier electrode, application of the law of KOENIG reveals that it is, in fact, the work-piece carrier electrode which will be practically exclusively sputtered by ions with sufficient average kinetic energy, whereas the wall of the vacuum chamber will be sputtered significantly less, because said energy is too small.

The magnetic fields which are further applied in tunnel-shaped form across the workpiece carrier electrode and/or across the vacuum chamber wall electrode are designed to obtain a uniform plasma processing along the workpiece carrier electrode to thereby maximize the workpiece size that can be handled by given plasma processing apparatus. As the electrode surfaces, which do confine the RF plasma discharge space, are of highly different extents, which prevents sufficient kinetic ion energy to occur at the larger electrode surface, the magnetic fields applied do not affect the distribution of ion energy at one electrode relative to that energy at the other electrode, but the plasma density at the smaller electrode, where average kinetic ion energy suffices for sputtering.

A similar apparatus as disclosed in U.S. Pat. No. 4,657,619 patent is also disclosed in U.S. Pat. No. 4,581,118 patent (Class) for sputter-coating a workpiece. Thereby, opposite to the workpiece carrier electrode and electrically isolated from the chamber wall electrode, a target electrode is mounted and RF energy is mutually fed between target electrode and workpiece carrier electrode. Thereby, obviously and as customary, for instance in view of safety considerations, the wall of the vacuum chamber confining as a third electrode together with the target electrode and the workpiece carrier electrode the RF discharge space is disposed at ground potential. Thus, this apparatus is a typical triode sputtering apparatus.

The U.S. Pat. No. 4,632,719 patent (Chow) discloses an apparatus for sputter-etching a substrate which is disposed centrally in a vacuum chamber on a workpiece carrier electrode to which RF energy is fed. Integrated in and at the same electrical potential as the wall surrounding the vacuum chamber, there is provided a catcher plate disposed opposite to the workpiece carrier electrode. Further, the workpiece carrier electrode is surrounded by a shield ring disposed at ground potential as is the wall of the vacuum chamber and thus the catcher plate.

In this apparatus, which acts as a typical diode sputtering apparatus, the RF plasma discharge is confined on one hand by the workpiece carrier electrode and, on the other hand, by the shield ring, the catcher plate and significant parts of the vacuum chamber wall surrounding the catcher plate. Applying the law of KOENIG to this arrangement reveals that due to the large ratio of electrode surface areas confining the RF discharge space, the average kinetic energy of ions will only suffice for considerable sputtering at the workpiece carrier electrode. A tunnel-shaped magnetic field is applied to the catcher plate and chamber wall electrode. This tunnel-shaped magnetic field generates a magnetic field in close proximity to the face of the wafer to be etched on the workpiece carrier electrode. Thereby, there, plasma density is improved, resulting in an improved etching rate and an improved uniformity of etching of the wafer. Thereby, a simple and inexpensive construction is realized due to mounting of the magnets to the grounded catcher plate for producing magnetic fields in close proximity to the face of the wafer to be etched.

Thus, in all diode sputtering apparatus mentioned above, the KOENIG law is considered in that the electrode to be sputtered is constructionally made significantly smaller than the second electrode confining the RF discharge. Thereby the applied large ratio of the two electrode surfaces confining the RF discharge space leads to a drop of time-averaged electric potential in the dark space region adjacent the small electrode considerably larger than such drop across the dark space region adjacent to the much larger electrode. Thereby, ion acceleration at the latter is, averaged, insufficient to lead to significant surface sputtering.

Any magnetic field applied to a dark space region, where ion acceleration does not suffice for sputtering, will have no effect on such sputtering. The influence on the distribution of electric potential drops can be neglected because the potential drop at the large electrode is already very small compared with the potential drop at the small electrode. Magnetic fields applied to a dark space region, where ion acceleration suffices for significant sputtering, will improve the sputter rate by increasing the plasma density.

A possibility to increase the surface of an electrode is described in the U.S. Pat. No. 3,661,761 patent and consists of placing protuberances on the electrode in the vacuum chamber which is not to be sputtered, in order to enlarge its surface area.

The same approach of large electrode surface area is used in the U.S. Pat. No. 3,369,991 patent.

In all diode sputtering arrangements mentioned above, and as was mentioned, concentration of sputtering action to one of the two electrodes confining the RF plasma discharge space is realized by constructionally providing a large surface area ratio of large surface not to be sputtered to small surface to be sputtered. Thereby a significant drawback of such technique is that the overall extent of the discharge space and, accordingly of a respective vacuum chamber, is predominantly given by the large extent necessary of the large electrode confining the RF plasma space. This large electrode not to be sputtered is thus not exploited as a target surface to be sputtered or to deposit workpieces to be etched.

Thus, this large electrode makes the arrangement bulky and does, in fact, not contribute to the extent of surface to be sputtered, which is considerably smaller. This is due to considerations according to the said law of KOENIG which apparently was believed to be unavoidable.

SUMMARY OF THE INVENTION

It is an object of the present invention to remedy the above mentioned drawback. This is achieved by a process for sputtering a surface of an object which comprises the steps of:
providing in a vacuum recipient a first and a second electrode with a first and a second electrode surface respectively;
selecting a gas pressure for a working gas to be applied to said vacuum recipient in a region defined;
confining a discharge space in said recipient by said first and second electrode surfaces, thereby preventing an RF discharge generated between said first and second electrode surfaces to spread outside said confinement;
generating an RF plasma discharge in said discharge space with said working gas at said selected gas pressure by applying an electric RF field between said first and second electrode surfaces, thereby generating in said space and adjacent said first electrode surface a first dark space region with a first drop of time-averaged electric potential and adjacent said second electrode surface a second dark space region with a second drop of time-averaged electric potential, said first and second drops of time-averaged electric potential falling towards said first and second electrode surfaces respectively;
selecting the ratio $R_{A12}$ of the areas of said first and second electrode surfaces to be $$0,.3 \leq R_{A12} < 1;$$

disposing said surface of said object in said second dark space region adjacent said second electrode surface being larger than said first electrode surface so as to face said first dark space region, thereby disposing said surface of said object one of at a floating electric potential and at the electric potential of said second electrode surface, so as to perform diode sputtering;
enabling sputtering of said surface of said object adjacent said second and larger electrode surface by applying a magnetic field within said discharge space, a predominant part of its lines of force being tunnel-like shaped on said first electrode surface and across said first dark space region.

Thereby it has inventively been recognized that at a vacuum recipient wherein in a diode sputtering arrangement the RF plasma discharge space is confined by two electrodes solely, which vacuum recipient thus would follow the kinetic energy ratio/surface area ratio of KOENIG, it becomes possible, in opposition to that law, to sputter the larger electrode if the electrode surface ratio of smaller electrode to larger electrode fulfils the above mentioned relation. This is inventively achieved by applying a tunnel-shaped magnetic field to the smaller of the two electrodes and providing the surface of a workpiece to be sputtered to be sputter-etched or of a target adjacent the larger electrode, i.e. within the dark space thereof.

According to known teaching one would believe that such a magnetic field would only increase the plasma density adjacent the small electrode and clearly not that, according to the invention, such a field would increase the averaged kinetic energy of ions impinging upon the larger electrode to such exploitable amount.

It thus becomes, additionally, possible to realize a small surface ratio of the confining two electrodes and to sputter adjacent the larger electrode surface, so that for instance with switching on and off of the said tunnel-like magnetic field, sputter may be switched from the small electrode surface according to the law of KOENIG and to the larger electrode surface inventively. Thereby none of the electrode surfaces must be construed significantly larger than the other one according to KOENIG'S LAW. The larger of the two electrode surfaces may be exploited for significant sputtering.

The above mentioned object of the invention is further realized by a process for sputtering a surface of an object which comprises the steps of:
providing in a vacuum recipient a first and a second electrode with a first and a second electrode surface respectively;

selecting a gas pressure for a working gas to be applied to said vacuum recipient;

confining a discharge space in said recipient defined by said first and second electrode surfaces, thereby preventing an RF discharge generated between said first and second electrode surfaces to spread outside said confinement;

generating an RF plasma discharge in said discharge space with said working gas at said selected gas pressure by applying an electric RF field between said first and second electrode surfaces, thereby generating in said space and adjacent said first electrode surface a first dark space region with a first drop of time-averaged electric potential and adjacent said second electrode surface a second dark space region with a second drop of time-averaged electric potential, said first and second drops of time-averaged electric potential falling towards said first and second electrode surfaces respectively;

selecting the ratio $R_{A12}$ of the areas of said first and second electrode surfaces to be $1 \leq R_{A12} \leq 3$;

disposing said surface of said object in said second dark space region adjacent said second electrode surface being smaller than said first electrode surface so as to face said first dark space region, thereby disposing said surface of said object at one of a floating electric potential and the electric potential of said second electrode surface, so as to perform diode sputtering;

reducing said first drop of time-averaged electric potential falling towards said first electrode surface being equal or larger than said second electrode surface below a value which would lead to substantial sputtering of said first electrode surface by applying a magnetic field within said discharge space, a predominant part of its lines of force being tunnel-like shaped on said first electrode surface.

Thereby, the invention further departs from the recognition that in a diode sputtering arrangement which fulfils the law of KOENIG and whereat the areas of the two electrode surfaces confining the RF plasma discharge space fulfil the mentioned ratio, the surface to be sputtered may be applied, as in the case of obeying the law of KOENIG, adjacent to the smaller of the two electrode surfaces, but the larger of these two electrode surfaces may significantly be reduced up to becoming of equal extent.

According to the law of KOENIG, lowering the ratio of large surface area of one electrode to small surface area of the other electrode up to a ratio of unity would clearly lead to increased sputtering of the larger surface electrode until such sputtering becoming equal when the two areas of the two electrodes become equal. One would have believed that applying a magnetic field to the larger electrode would rather only increase plasma density at that electrode and thus possibly the sputter rate at this electrode, but not that such a magnetic field would lower the average kinetic energy of ions impinging on the larger electrode so as to significantly reduce its sputtering.

Besides inventively leading to a shift of the ratio of averaged kinetic ion energy at the two electrodes, departing from such ratio predicted by the law of KOENIG, the inventively applied tunnel-shaped magnetic field does additionally increase the plasma density of the RF plasma discharge adjacent that of the two electrodes on which it is applied. This is of no harm, because lowering the averaged kinetic ion energy at those electrodes reduces the sputter rate even if the plasma density—of charged carriers with insufficent energy—rises.

Nevertheless, this leads to a preferred mode of setting the said tunnel-shaped magnetic field by increasing the plasma density in that dark space region, where-across the magnetic field is applied at least by a factor of ⅓ compared with plasma density in said region without applying the magnetic field.

As was mentioned above and under a first aspect of the present invention, by maintaining a ratio $R_{A12}$ of the surface areas of the two electrode surfaces confining the RF plasma discharge space, it becomes possible by inventively applying tunnel-shaped magnetic fields to the smaller of the two electrodes to increase the average ion energy adjacent and towards the larger of the two electrodes, so that sputtering of a sputtering object may be performed there. Predominant sputtering at the larger electrode surface would not be possible according to the law of KOENIG.

Thereby the ratio $R_{U21}$ of the drop of time-averaged electric potential across the second dark space region adjacent to the larger second electrode surface to the drop across the first dark space adjacent the first and smaller electrode surface is incresed by the magnetic field to become $$R_{U21} \geq 1,$$

and preferably even to be larger than 1.4 or even to be larger than 1.7. It may become significantly larger as a function of rising RF discharge voltage.

Given these ratios of drops of time-averaged electric potential across the two dark spaces considered, it thus becomes possible to select the absolute values of the said two drops so that the one across the first dark space adjacent to the smaller electrode surface becomes substantially ineffective for sputtering, in that ion acceleration leads there to average kinetic energy which will not suffice to sputter a predetermined material at the smaller electrode.

According to the second aspect of the invention, sputtering is performed adjacent to the smaller electrode surface which is still similar in extent to the larger electrode surface as given by the relation $$1 \leq R_{A12} \leq 3.$$

By inventively applying the magnetic field to the larger electrode, the ratio $R_{U21}$ of the drop of time-averaged electric potential across the second dark space, adjacent the smaller electrode surface, to the said drop across the first dark space, adjacent the larger electrode surface, is preferably selected to be $$R_{U21} \geq 2,$$

$$R_{U21} \geq 2,5,$$

$$R_{U21} \geq 3.$$

$R_{U21}$ may here, too, become significantly larger with increasing RF discharge voltage.

Thereby $R_{U21}$ becomes so large—in spite of similar extent of the electrode surfaces —that the smaller of the said of drops of time-averaged electric potential may easily be selected below 30–50V, a value where practically no sputtering occurs.

As was mentioned above and under both aspects of the present invention, it is not necessary to inventively provide the magnetic field to exclusively comprise lines of force which leave one of the specified electrode surfaces and re-enter the same electrode surfaces. It is absolutely possible to have a certain amount of magnetic field flux leaving one of the electrodes and entering the other one.

This is of high importance in view of the following facts:

As is known from magnetron technique, plasma density adjacent to an RF plasma discharge generating electrode may be incresed by applying across the dark space of the electrode considered a tunnel-shaped magnetic field. Obviously, this is done in a sputtering apparatus at that electrode adjacent to which or on which sputtering is to be performed.

According to the present invention, this electrode will be either the larger electrode and in this case the inventively applied magnetic field is applied to the smaller electrode, or will be the smaller electrode and in this case the inventively applied magnetic field will be applied to the larger electrode.

Thus, and as a further object of the invention, sputtering rate is improved by applying a further magnetic field within the discharge space, a predominant part of its lines of force being tunnel-like shaped on the second electrode. This as well where the second electrode is the larger one and is to be sputtered, and where the second electrode is the smaller one and is to be sputtered.

It is of high importance for practicability that it has been recognized that the inventively reached shifting of the ratio $R_{U21}$ with respect to such ratio as predicted by KOENIG will occur as long as a minimal ratio of that part of the inventively applied magnetic field, which forms a tunnel-like pattern, to that part of this field which leaves one electrode surface and penetrates the other one, is substantially maintained. Such minimal ratio K is defined later and should preferably be larger than 2.

It is a further object of the present invention to additionally achieve, by the inventively applied magnetic field, control of the distribution of sputtering along the surface to be sputtered. This is realized by controlling such distribution by increasing plasma density adjacent the surface to be sputtered and at selected loci by the magnetic field inventively applied.

BRIEF DESCRIPTION OF THE DRAWINGS

The present invention will be better understood and objects other than those set forth above will become apparent when consideration is given to the following detailed description thereof. Such description makes reference to the annexed drawings, wherein:

FIG. 1 shows schematically a vacuum recipient at which the invention may be implied and several possibilities of RF feed;

FIGS. 2a and 2b schematically two further kinds of vacuum recipients at which the invention may be implied;

FIGS. 3a to 3e for a vacuum recipient as shown in the FIGS. 1 or 2, schematically the arrangement of the two RF electrodes defining five different ratios of electrode surface area and the resulting characteristics of time-averaged electric potential between the two electrodes respectively according prior art techniques (pa) and according to the present invention (i);

DETAILED DESCRIPTION OF THE INVENTION AND OF THE PREFERRED EMBODIMENT

Figure 4A:
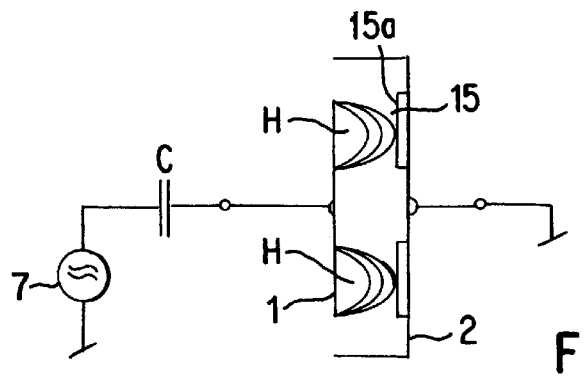
FIGS. 4a and 4b again schematically, the two electrodes of an inventive sputtering apparatus with magnetic fields inventively applied and, additionally, influencing plasma density adjacent the surfaces to be sputtered.

In FIG. 1 an RF plasma discharge space 3 is confined exclusively by two electrodes 1 and 2. As schematically shown by three alternative connections, L, M, N in one case, the electrode 2 is connected to an RF generator 7 via a DC-decoupling capacitor C, whereas electrode 1 is connected to a reference potential, usually to ground potential. As a second variant M, electrode 2, which is shown as being a hollow electrode, is connected to reference potential, normally to ground potential, whereas electrode 1 is connected via a DC-decoupling capacitor C to RF generator 7. As a third and fourth variant (latter not shown), either electrode 1 or 2 is again connected via decoupling capacitor C to an RF generator 7a which itself is not referred to reference potential as RF generator 7, but which is connected to the other electrode 2 or 3. One of the electrodes as shown, e.g. electrode 1, which is not decoupled from DC potential by capacitor C, is set to a reference DC potential $\emptyset_o$, as e.g. by a DC power supply 7b.

Common to all variants is that one of the two electrodes is decoupled from DC potential externally applied, so that it may freely float with respect to electric potential, whereas the second electrode is bound to a preselected DC potential. Such an arrangement is defined at least throughout the present description as a "diode" RF plasma arrangement, if no further part is exposed to the discharge space 3 which is loaded by an RF current, which current is led out of the confinement.

The plasma discharge space 3, as shown in FIG. 1, is exclusively confined by the surfaces of the electrodes 1 and 2. The discharge is prevented from spreading out of that confinement. Thus, a gap 9, which is provided e.g. to electrically and mutually isolate the two electrodes 1 and 2, is not larger than given by a minimal distance—according to its width d. It is substantially smaller than dark space distance, i.e. the distance between RF electrode surfaces at which no plasma may be initiated at a given pressure of working gas in the space between such electrodes. The dark space distance is, as known to the man skilled in the art, dependent upon different parameters such as the pressure of a working gas in the plasma discharge space, be it a noble gas, such as e.g. Argon, and/or a reactive gas, on geometric structure of the electrodes, the existence of magnetic fields, etc. A reactive gas is applied to the plasma discharge space 3 when an RF plasma treatment process shall be performed by reacting the reactive gas with particles sputtered from the sputtering object.

Thus, according to FIG. 1, any gap in the confinement formed by the two electrodes 1 and 2 for the RF plasma discharge space shall be of such small extent that the plasma may not spread out of the confinement space. This is fulfilled, as known to the man skilled in the art, when the width of the gap 9 according to minimal diameter of that gap is not substantially larger than dark space distance, which latter, dependent from the working gas pressure in the plasma discharge space, is in the range of mm up to few cm for working gas pressures customarily used for RF plasma sputtering.

A wall of a vacuum chamber 11 is usually connected to ground potential.

According to FIG. 2a, instead of providing an open gap 9 according to FIG. 1, the two electrodes 1 and 2 confining the plasma discharge space 1 may be mutually separated by a dielectric part 13. Thereby such a confined RF plasma discharge space 3 may lie within a vacuum chamber 11 or may itself, as shown in FIG. 2b, provide for a vacuum-tight self-contained vacuum chamber.

In such a diode sputtering arrangement, as schematically shown in the FIGS. 1 or 2, either the surface of a target to be sputtered—for sputter-coating a workpiece—or the surface of a workpiece to be sputter-etched is disposed within and facing the discharge space, either at a floating DC potential, especially if such a surface to be sputtered is of dielectric material, or at the electric potential of one of the electrodes 1 or 2, especially if target or workpiece are of electrically conductive material.

An object to be sputtered, be it a target or a workpiece, will be referred to throughout the present description as a "sputtering object".

Further, throughout the following description the electrodes 1 and 2 may be connected in any one of the variants shown in FIG. 1 and may be mutually isolated either according to FIG. 1 or to FIG. 2 without that such connection and/or mutual isolation would anyhow affect the invention to be described. To which electrode a reference potential is set, i.e. which of the electrodes is maintained at to a DC-reference potential, will only affect the reference of electric potential with respect to which potential differences, i.e. voltage entities, are defined.

It has to be noted that the electrode surfaces of the electrodes 1 or 2 respectively, which point towards the RF plasma discharge space 3, need not necessarily be electroconductive, but one or both of these electrodes may have a dielectric covering as shown at 2a in FIG. 2a, which would not negatively affect coupling of RF energy into the discharge space 3, but which would just form a decoupling capacitor C. Such an embodiment, too, is to be considered throughout the present description as a diode arrangement. Nevertheless, up to the present moment, the invention has been carried out as a best mode of realization as a diode arrangement as shown in the FIGS. 1 or 2.

The invention shall now be explained with the help of FIGS. 3($a_{PA}$) through ($e_{PA}$) and ($a'_{PA}$) through ($e'_{PA}$)

In FIGS. 3 ($a_{PA}$) through ($e_{PA}$) and ($a'_{PA}$) through ($e'_{PA}$) five (a to e) different constellations of ratio of the surface areas of the electrodes 1 and 2 are shown, together with the resulting qualitative distribution of time-averaged electric potential in the discharge space. On the left (PA) the known conditions are shown resulting from the KOENIG law and on the right (i) the conditions which inventively prevail.

First, FIG. 3($a_{PA}$) will be described in closer detail to facilitate description and discussion of the further cases shown in the various arrangements of FIG. 3.

According to FIG. 3$a_{PA}$ the surface area of electrode 1 pointing towards the plasma discharge space 3 is significantly smaller than the respective area of electrode 2. As an example out of the different possibilities which have been described in connection with FIG. 1, electrode 2 is connected to reference potential, whereas electrode 1 is DC-decoupled by capacitor C and connected to RF generator 7. It has further to be pointed out that, obviously, the two electrodes 1 and 2 do confine the plasma discharge space 3, as was shown in the FIGS. 1 or 2, and the simplified representation of FIG. 3 is only selected for clarity's sake.

The ratio of the surface area of electrode 1 to that area of electrode 2 is $R_{A12}$.

When RF energy is coupled into the discharge space 3 with a working gas at preselected pressure, for instance with Argon at 0.5 Pa, and with a frequency above 3 MHz and below approximately 900 MHz, an RF plasma is generated in space 3. Adjacent to both electrode surfaces a so-called dark space region is formed. The width of the respective dark space region is schematically indicated by $d_1$ and $d_2$. As was explained above, the width of the dark space region largely depends on the preselected pressure of working gas in discharge space 3 and the drop of potential along that dark space. Along the central area of the plasma discharge there occurs practically no drop of electric potential $\emptyset_{pl}$ averaged over time. In contrary thereto, a significant drop of time-averaged electric potential occurs across the two dark space regions. The potential of electrode 2 is fixed at reference potential, e.g. at ground potential which forms thus the reference potential for the overall characteristic of time-averaged electrical potential $\emptyset$ in the space between the two electrode surfaces.

With respect to reference potential the central area of the plasma discharge where practically no drop of time-averaged electrical potential occurs, defines the voltage $U_{pl}$.

The respective drops of time-averaged electrical potential across the dark space regions provide for large respective electrical fields across the regions by which positive ions formed from the working gas are accelerated to the respective electrode surfaces. We consider positive ions as the sputtering, heavy ions.

The respective accelerating drop of electric potential is respectively defined as the voltage $U_1$ across the dark space region of electrode 1 and $U_2$ across the dark space region of electrode 2.

In the example according to FIG. 3($a_{PA}$) and according to the law of KOENIG which reads $$R_{A12}^4 = \left\{\frac{A_1}{A_2}\right\}^4 = \frac{U_2}{U_1} = R_{U21}$$

and wherein A denotes the respective area of electrode surface, the accelerating drop $U_1$ across the dark space region adjacent to the small electrode 1 is significantly larger than the voltage drop $U_2$ adjacent to the significantly larger electrode 2, as $R_{A12} \ll 1$.

When we speak of larger and smaller electrodes in this context, there shall always be meant the respective electrode surface pointing to the plasma discharge space 3, i.e. conducting an RF current to the plasma.

The condition, as schematically shown in FIG. 3($a_{PA}$) accords to $R_{A12} \ll 0.3$.

The accelerating drop $U_2$ does not suffice to lead to a significant sputtering of the larger electrode 2, because the averaged kinetic energy of the ions impinging on electrode 2 is too small. The acceleration drop $U_1$ leads to significant and clearly dominant sputtering of a sputtering object at electrode 1. The significant sputtering is schematically shown in the figures by the arrow S.

If, as shown in FIG. $3(a'_{PA})$ a magnetic field H is applied with lines of force forming a tunnel-like pattern on the smaller electrode 1 and across its dark space region, this will, at least in first approximation, not affect the distribution of time-averaged electric potential $\phi$ as shown in FIG. $3(a_{PA})$.

Thus, the respective averaged kinetic energies of the two dark space regions will not be altered.

Nevertheless, and as known in the art, such a magnetic field H will increase the plasma density in the dark space region adjacent to smaller electrode 1, in other words, the density of charge carriers in that dark space region and thus the number of positive ions accelerated towards electrode 1 per unit time. As their kinetic energy is large enough for sputtering, thereby the sputter rate will be improved.

The techniques according to FIGS. $3(a_{PA}$ and $3a'_{PA})$ are known for $R_{A12} << 0.3$.

According to FIG. $3(b_{PA})$ the surface area ratio $R_{A12}$ shall be risen to a value of $R_{A12} \geq 0.3$, namely of about 0.6. Thereby and following the law of KOENIG, the ratio of accelerating voltages $U_2$ to $U_1$ rises. Thereby, $\phi_{pl}$ especially the accelerating drop $U_2$ across the dark space region adjacent to the larger electrode 2 becomes larger, leading to the fact that sputtering of the electrode 2 becomes more significant, whereby the rate of sputtering at electrode 2 is still lower than the rate of sputtering at the smaller electrode 1.

If, according to FIG. $3(b_i)$ a magnetic field H is now inventively applied to the smaller electrode 1 at the said ratio of surface areas $R_{A12} \geq 0.3$, a significant difference occurs compared with the case according to FIG. $3(b_{PA})$, where the law of KOENIG reigns. The plasma potential $\phi_{pl}$ rises and, as of special importance, the voltage drops $U_2$ and $U_1$ become at $R_{A12} \approx 0.6$ substantially equal, so that both electrodes 1 and 2 are sputtered with ions of about equal average kinetic energy in contradiction to the law of KOENIG.

This phenomenon is the basis of the present invention which significantly starts at a surface area ratio $R_{A12} \geq 0.3$. There the larger electrode becomes significantly sputtered by applying the magnetic field H to the smaller electrode, which leads to a characteristic of time-averaged electric potential which significantly differs from that characteristic which is encountered without magnetic field H and which latter is governed by the law of KOENIG.

According to FIG. $3(c_{PA})$ the surface areas of the two electrodes 1 and 2 are made equal. According to the law of KOENIG, the voltage drops $U_1$, $U_2$ across the respective dark space regions become equal. Thus both electrodes 1 and 2 are equally sputtered. When applying, according to the present invention, and as shown in FIG. $3(c_i)$, the magnetic field H to the electrode 1 the voltage $U_1$ is significantly reduced, so that only the electrode 2 is significantly sputtered.

According to FIG. $3(d_{PA})$, the electrode surface of electrode 1 is larger than the electrode surface of electrode 2. This according to a surface ratio $R_{A12} \leq 3$, e.g. of $R_{A12} \approx 2$. Thereby, and following the law of KOENIG, the drop $U_2$ becomes significantly larger than the drop $U_1$ and the now smaller electrode 2 is more sputtered in analogy to the case of FIG. $3(b_{PA})$.

If, according to FIG. $3(d_i)$, inventively, the tunnel-shaped magnetic field H is applied to the now larger electrode 1, the accelerating drop $U_2$ is further increased and the accelerating drop $U_1$ reduced practically to zero, leading to far predominant sputtering of electrode surface 2 as $U_1$ may drop below sputtering-limit voltage of e.g. 30–50V. Without inventively applying the inventive field H, according to FIG. $3(d_{PA})$, the larger electrode surface 1 would still be considerably sputtered.

According to FIG. $3(e_{PA})$ the ratio of electrode surfaces $R_{A12}$ is further increased to be $R_{A12} >> 3$. There, and according to the law of KOENIG, exclusively the smaller electrode 2 is sputtered, which is not affected by applying the magnetic field H as shown in FIG. $3(e'_{PA})$ to the significantly larger electrode 1.

Thus, the present invention is directed on application of the magnetic field H and realizing the surface area ratio $R_{A12}$ to be $$0{,}3 \leq R_{A12} \leq 3.$$

Thereby, the inventively applied magnetic field H leads to especially significant results, where $$0{,}5 \leq R_{A12} \leq 2$$

is valid.

Beyond the mentioned limits for the surface ratio, inventive application of the magnetic field H does not anymore affect significantly and to an exploitable amount the distribution of the electric potential $\phi$.

As has been explained up to now, inventively the magnetic field H is applied to either the smaller of the two electrodes or to the larger of the two electrodes to shift the characteristic expected by the law of KOENIG, whereby the inventively applied magnetic field is always applied to that electrode which is not intended to be sputtered, in other words, not to that electrode adjacent to which the sputtering object is provided. The effect exploited according to FIG. 3 the various arrangements does not necessitate a substantial part of the flux of the tunnel-shaped magnetic field to penetrate through or pass adjacent the surface to be sputtered of the sputtering object.

Nevertheless, and as will be explained with the help of the schematic FIGS. 4 and 5, the inventively applied magnetic field H may additionally be tailored to generate a significant flux of magnetic field adjacent and on the surface to be sputtered, thereby to rise the density the RF plasma adjacent the said surface, besides of providing for the mentioned shift in the surface-ratio/acceleration voltage drop-ratio characteristic of KOENIG.

Figure 4B:
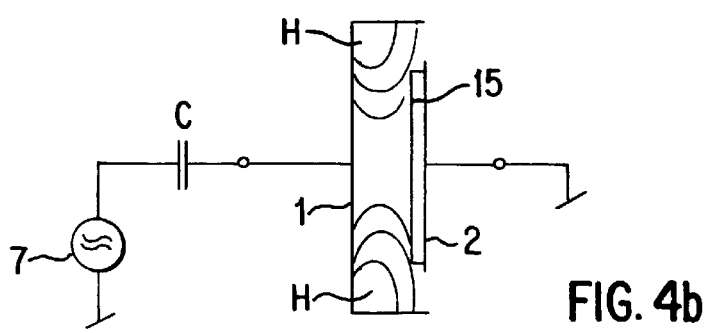

In FIG. 4, which again schematically shows the configuration of the two electrodes 1 and 2, the inventively applied magnetic field H is applied to the smaller electrode 1 generally according to FIG. $3(b_i)$, whereas sputtering objects 15 are disposed on the larger electrode 2, so that their surfaces 15a to be sputtered are disposed in the dark space region of electrode 2. As shown in FIGS. 4(a) and 4(b), the inventively applied magnetic field H generates a significant flux adjacent the surfaces 15a. Thereby, the plasma density in the dark space adjacent electrode 2 rises, which leads to a higher sputtering rate of the surfaces to be sputtered due to higher density of higher energy charged particles in the said dark space region. By appropriately tailoring the magnetic fields H with respect to the surfaces 15a, the plasma density in the said dark space region is locally risen, so as to selectively control the sputtering rate at the surfaces 15a and therewith the distribution of sputtering rate along the said surfaces 15a. The average kinetic energy of the ions impinging on electrode 2 is given by field H on electrode 1 and is substantially not affected from whether field H expands to surfaces 15a or not.

According to FIG. 4(b), this effect is exploited, too, where the inventively applied magnetic field H is applied to the electrode 1 being larger than electrode 2 according to the case of FIG. 3($d_i$) to improve plasma density, for instance at the periphery of a sputtering object 15 disposed on smaller electrode 2.

Figure 5:
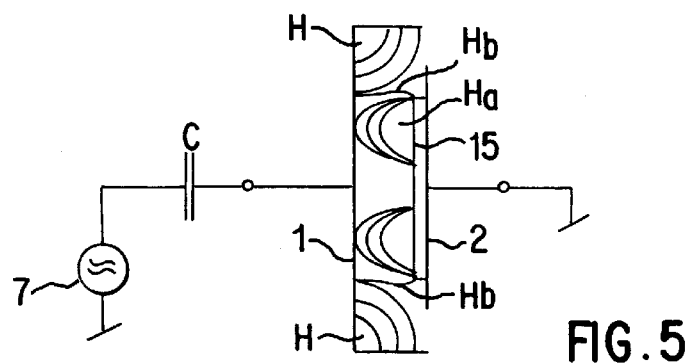
FIG. 5 a schematic representation according to FIG. 4, whereat, additionally to the inventive magnetic field, a further magnetic field is applied across the surface to be sputtered.

According to FIG. 5, additionally to the inventively applied magnetic field H to the larger electrode 1, according to FIG. 4(b), a further magnetic field with tunnel-shaped lines of force $H_a$ is applied, as known for instance from the Planar Magnetron Technique, to the sputtering objects 15 to improve plasma density in the dark space region of sputtered electrode 2. Depending on the relative configuration of the inventively applied magnetic field H and the plasma density improving magnetic field $H_a$ there results in the RF plasma discharge space a magnetic field pattern, resulting from superposition of the two magnetic field components H and $H_a$. Thereby the resulting field may have a significant part with lines of force leaving one electrode and penetrating the other electrode, as schematically shown at $H_b$.

In connection with such cases, where on one hand a magnetic field H, according to the principle of the present invention, is applied and additionally a magnetic field in magnetron-like manner across the surface to be sputtered and where from these two field components the resulting magnetic field has lines of force which lead from one electrode surface to the other, it has been recognized by the inventors of the present invention that the effect, which was described in connection with the various arrangements of FIG. 3, is maintained even if a part of the magnetic field inventively applied has lines of force which are not tunnel-shaped, but which lead from one electrode to the other.

The effect inventively exploited is maintained if the flux of that part of the magnetic field H inventively applied, which is tunnel-like shaped, and the flux of that part of the magnetic field applied, which leads from one electrode surface to the other, fulfils a certain relation as will be explained with the help of FIG. 6.

Figure 6:
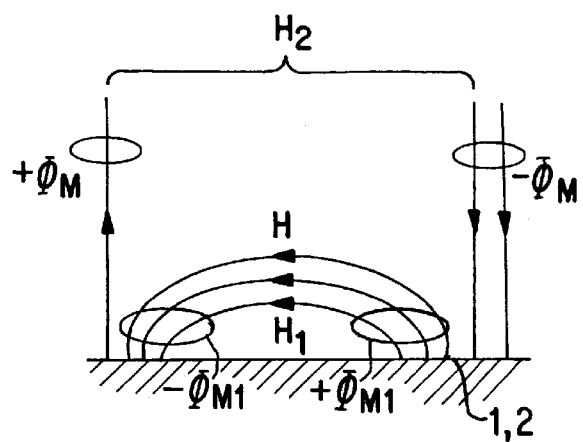
FIG. 6 a schematic representation of an electrode surface with the inventively applied magnetic field with lines of force in a tunnel-shaped pattern and leading from one electrode to the other to explain definition of a value K, important in connection with the present invention.

In FIG. 6 one of the electrodes 1 or 2 is schematically shown with the inventively applied magnetic field H. A part, $H_1$, of the magnetic field has lines of force which are tunnel-like shaped on the respective electrode surface and across the respective dark space region, and a part, $H_2$, with lines of force leading from one electrode surface to the other.

The overall sum of the absolute fluxes $|\phi_M|$ on the electrode surface is $$|\phi_M| = \int_A \int |\phi_{Mx}| dA$$

Thus, the flux $\phi_{M1}$ of the tunnel-shaped part appears in that absolute value as $2\phi_{M1}$ and all further fluxes $\phi_{Mx}$ appear irrespective of their signum. The flux $\phi_M$ on the surface of the electrodes is $$\phi_M = \int_A \int \text{sign}\phi_{Mx} \cdot |\phi_{Mx}| dA$$

wherein the tunnel-shaped part of the magnetic field does not contribute because its flux appears with positive and negative signum.

There is defined the coefficient K as follows:

$$K = \left| \frac{|\Phi_H|}{\Phi_H} \right|$$

It has been recognized that the inventively exploited effect is significant and thus worth being exploited over the entire range for $R_{A12}$ when K is selected to be

K>2.

Figure 7:
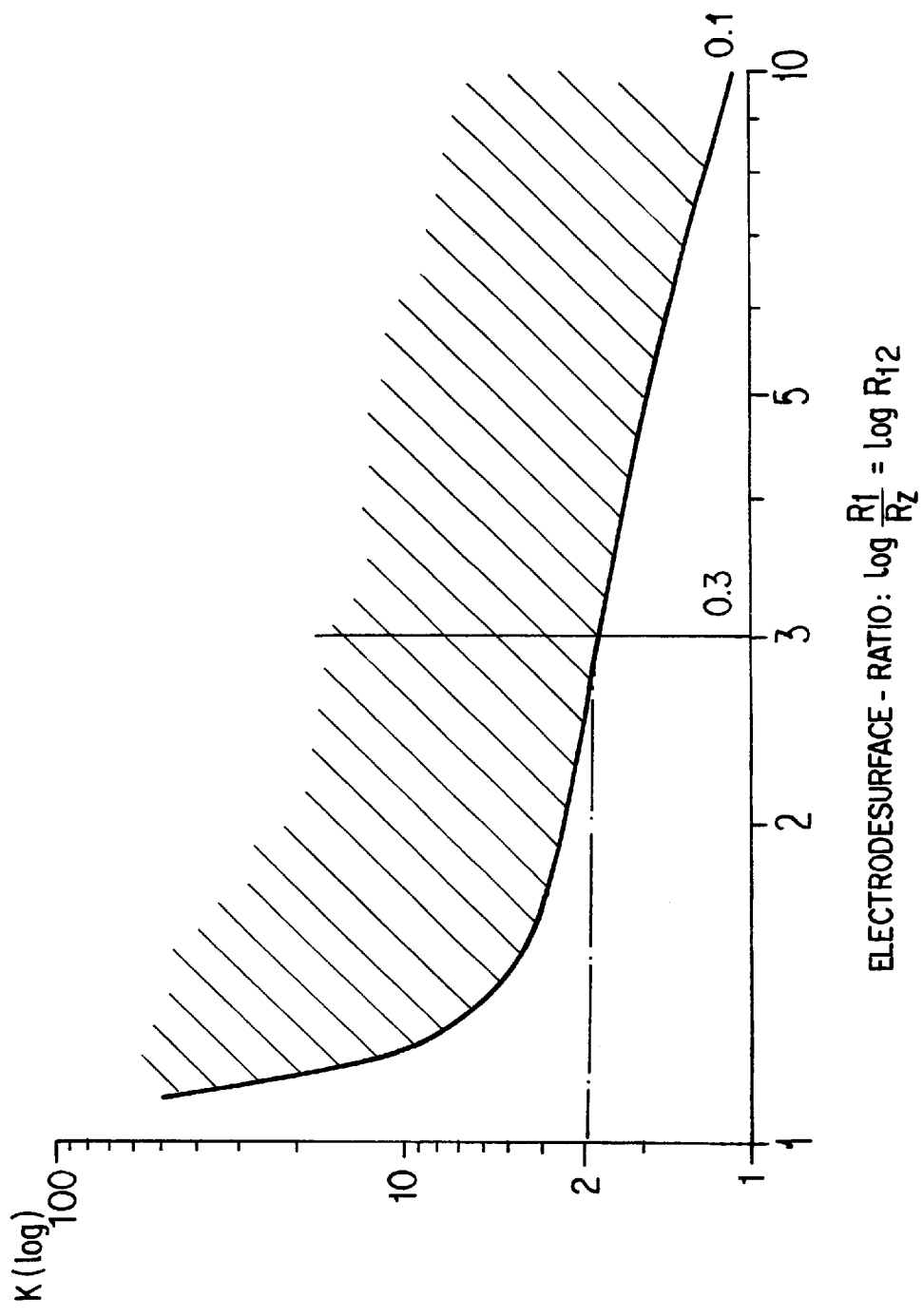
FIG. 7 shows as a function of the electrode surface area ratio and of selection of the K value, preferred area of realizing the present invention.

In FIG. 7 the horizontal axis shows in logarithmic representation $R_{A12}$, both for $0,1 \leq R_{A12} \leq 1$ and for $1 \leq R_{A12} \leq 10$. The vertical axis shows the value of K in logarithmic scaling. The line X shows the limit of $R_{A12}$, inventively exploitable, i.e. the present invention is especially exploitable in the left hand area of limit line X. Above and on the characteristic line Y at K=2 only one of the two electrodes is significantly sputtered. As may be seen for equal electrodes ($R_{A12}$=1), the K value should be taken very large, which means that the inventively applied magnetic field H should exclusively have lines of force in the said tunnel-shaped pattern. Below the line Y, the second electrode also starts to be significantly sputtered, in the direction of arrow P more and more up to equal sputtering of both electrodes at $R_{A12}$=1 and K=1, i.e. no tunnel-like pattern.

As in most practical applications of sputtering techniques, it is desired to sputter a sputtering object only at one surface, and thereby to exclude sputtering of one of the electrodes, especially for processes with highest demands concerning cleanness of the process environment, to prevent particles sputtered off the one electrode to contaminate the object. Therefore it is proposed to select the K value according to

K≧2, so as to exploit in a preferred form of the present invention the area Z of the characteristic of FIG. 7 above and on the limiting line at K=2 and on the left of the limiting line X. This, as was mentioned, in the case where practically exclusive sputtering at one electrode is desired. In the overall area Z, sputtering of the second electrode will be so low that it may be neglected in most application cases of sputtering technique.

Figure 8:
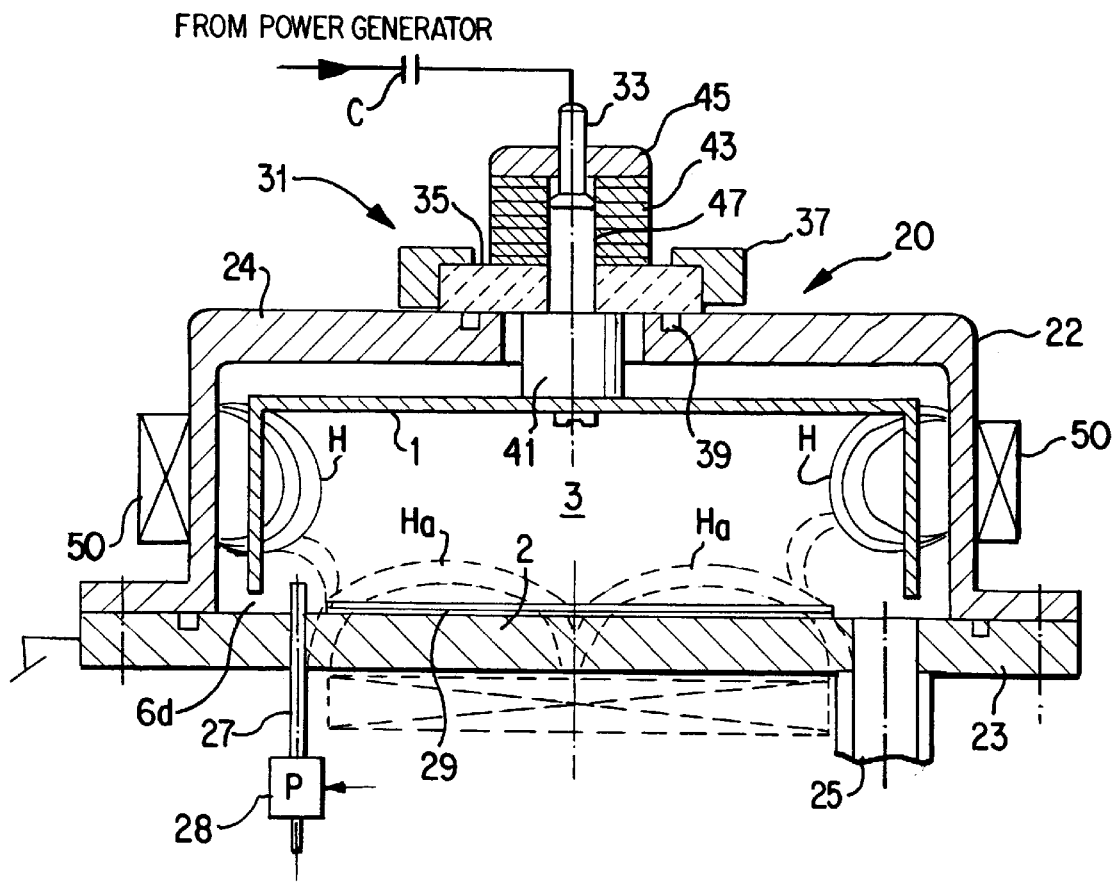
FIG. 8 shows, in a cross-sectional representation, a first preferred embodiment of an inventive apparatus operating according to the inventive process, where a surface of an object is RF sputtered, disposed adjacent the smaller electrode.
Figure 9:
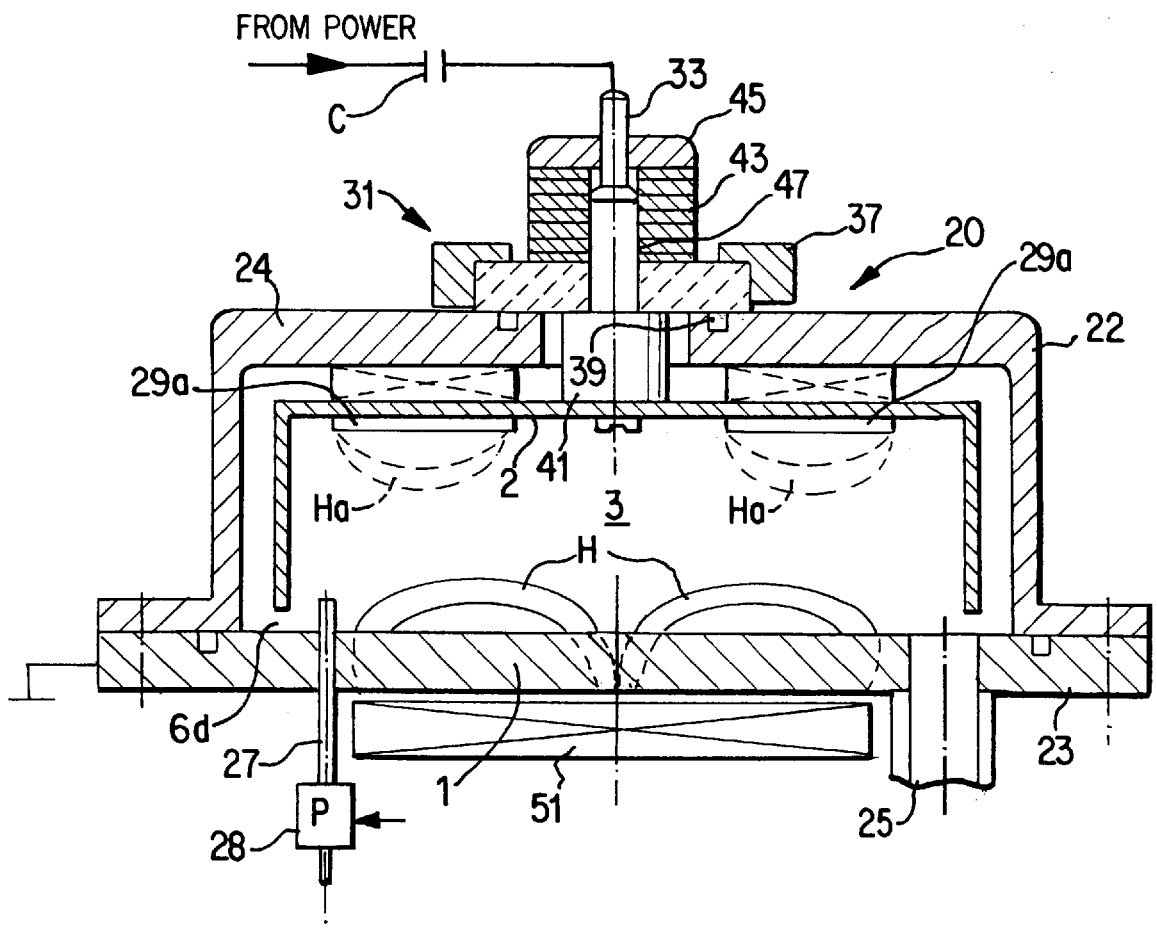
FIG. 9 shows, in a representation in analogy to that of FIG. 8, the preferred apparatus where objects to be sputtered are disposed adjacent the larger electrode.

In the FIGS. 8 and 9 two forms of an inventive sputtering apparatus are shown, as best mode of realization tested up to now, whereby the embodiment according to FIG. 8 provides for sputtering a sputtering object on the smaller electrode—2—surface according to FIG. 3($d_i$), and the embodiment of FIG. 9 provides for sputtering of sputtering objects adjacent the larger electrode—2—according to the embodiment of FIG. 3($b_i$).

According to FIGS. 8 and 9, a vacuum chamber 20 is formed by a metallic wall 22 with upper part 24 and base part 23. The inside of the vacuum chamber is evaporated via a suction port 25 by means of a vacuum pump (not shown). A working gas as a noble gas or gas mixture, for instance Argon, and/or a reactive gas, is inlet through a gas inlet 27 with pressure regulating valve 28. Within the vacuum chamber 20 the RF plasma discharge space 3 is confined by the electrodes 1 and 2. According to FIG. 8, electrode 2 is formed by the bottom wall of the vacuum chamber 20 and is set on ground potential. Disposed on the electrode 2 of FIG. 8 is a sputtering object 29, be it a target to be sputtered or a workpiece to be sputter-etched. The hollow electrode 1 is connected via capacitor C to an RF power generator by means of an RF connector 31 with RF feed-through through the upper part 22 of the vacuum chamber wall. To apply RF energy to electrode 1, there is provided a conductor tab 33 connected to electrode 5 and carried by an insulating plate 35, which, in turn, is screwed in vacuum-tight manner in an opening in part 22 by means of a flange-ring 37 and using a gasket 39. The conductor tab 33 extends mutually isolated to the wall of the chamber 20 through its opening and carries at 41 electrode 1.

An insulator 43 is spanned by means of a nut 45 and presses gasket 39 and a further gasket 47. The surface area ratio $R_{A12}$ is in FIG. 8 about 0.3, in FIG. 9 about 3. The one hollow electrode and respectively the other electrode confine the RF plasma discharge space 3. The border of the hollow electrode is distant from the bottom part 23 forming the other electrode by less than dark space distance d at the operating conditions of the sputtering apparatus.

The distance between the reverse side of the hollow electrode and the upper part 22 of the chamber wall is also less than the dark space distance.

In FIG. 8, magnetic field generating means formed by permanent and/or electro-magnets are arranged as shown at 50 outside upper part 22, which is at least in the area of this means 50 of non-magnetic material, as well as at least that part of electrode 1, so that the magnetic field generating means 50 generate the inventive magnetic field H at the side-walls of the hollow electrode 1 predominantly with a pattern of lines of force in tunnel-like shape on electrode 1 and across its dark space region.

The embodiment of FIG. 9 is exactly the same as that of FIG. 8 with the sole difference that the sputtering objects 29a are disposed adjacent the larger electrode 2, and the inventively applied magnetic field H applied by magnetic field generator means 51 is applied on the smaller electrode 1. This accords with the case discussed in connection with FIG. 3($b_i$).

In both embodiments of FIGS. 8 and 9 and as shown in respective broken lines, a further magnetic field $H_a$ of the magnetron type may be applied to improve plasma density adjacent the surface to be sputtered as was explained in connection with FIG. 5. Thereby, and as shown for instance in FIG. 8 in dash-dotted lines, there may occur a part of the resulting magnetic field to have lines of forces leaving one electrode and penetrating the other one, thus establishing a K value lower than infinity.

With the embodiments shown in the FIGS. 8 and 9, but with different ratios of electrode surface area, $R_{A12}$, varied between 0.5 and 2. The resulting voltage $U_{1GND}$, according to FIG. 3($a_{PA}$), was measured, as well as the voltage $U_{pl}$ respectively with and without inventive application of a magnetic field H.

The following parameters were set:

| | |
|---|---|
| frequency: | 13, 56 MHz |
| working gas: | Argon |
| working gas pressure: | 0, 2 Pa resulting in dark space distances of about 10 mm |
| RF voltage: | 600 $V_{PP}$ |
| diameter of hollow electrode: | 400 mm |
| axial extent of hollow electrode: | 100 mm |
| object: | $SiO_2$ coated Si-wafer |
| Flux of tunnel-shaped field: | 240 Gauss adjacent electrode surface and perpendicular to electrode surface |
| K value: | >5 |

Figure 10:
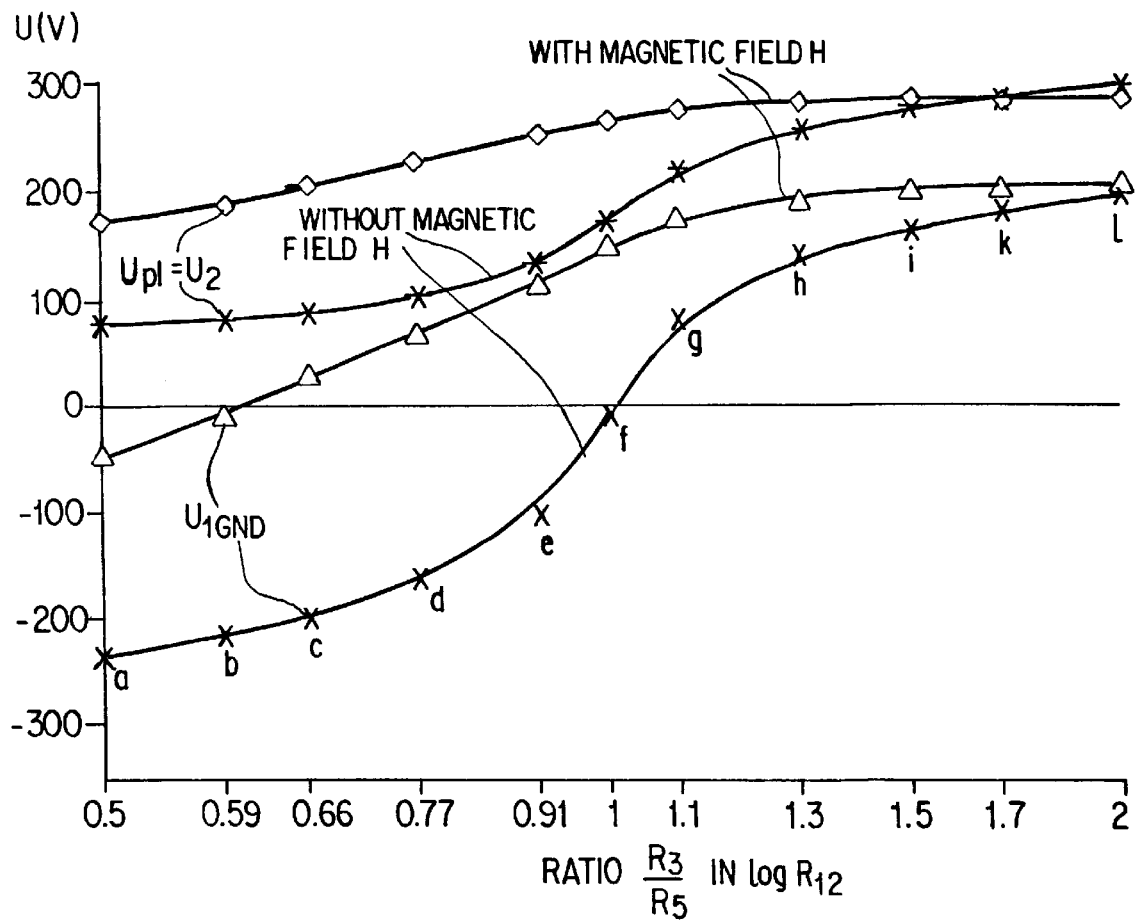
FIG. 10 shows, in dependency of the electrode surface area ratio, the course of ion accelerating voltage at one electrode and at the other electrode as defined by $U_{1GND}$ and $U_{pl}$ in FIG. $3a_{PA}$, with and without inventively applying a magnetic field.

The results are given in the following table and plotted in FIG. 10:

| Pos | $R_{A12}$ | $U_{1GND}$ (V) | $U_{pl} = U_2$ (V) | $U_1$ (V) | $U_1/U_2$ |
|---|---|---|---|---|---|
| a | 0, 5 | −47 | 172 | 219 | 0, 79 |
| b | 0, 59 | −13 | 186 | 199 | 0, 93 |
| c | 0, 66 | +30 | 207 | 177 | 1, 17 |
| d | 0, 77 | +70 | 228 | 158 | 1, 44 |
| e | 0, 91 | +115 | 252 | 137 | 1, 84 |
| f | 1 | +150 | 265 | 115 | 2, 30 |
| g | 1, 1 | +175 | 275 | 100 | 2, 75 |
| h | 1, 3 | +190 | 281 | 91 | 3, 10 |
| i | 1, 5 | +199 | 282 | 83 | 3, 40 |
| k | 1, 7 | +200 | 280 | 80 | 3, 50 |
| l | 2, 0 | +204 | 283 | 79 | 3, 58 |

For instance at a surface ratio of approximately 0,6, the voltage $U_{1GND}$ becomes approximately 0. Thereby, $U_{pl}$ is about 190V. Thus, the accelerating voltage $U_1$ at the smaller electrode is about 190V. With respect to the grounded larger electrode, consequently the accelerating voltage $U_2$ is about 190V, too. This accords with the case according to FIG. 3($b_i$), where the larger and the smaller electrodes are approximately sputtered to the same extent.

It may further be seen that without applying the magnetic field H, the voltage $U_{1GND}$ would be approximately −200V at a plasma voltage $U_{pl}$ of approximately 90V, which would lead to an accelerating voltage drop $U_1$ of 290V at the smaller electrode and an accelerating voltage drop $U_2$ of 90V at the larger electrode and thus to a clearly predominant sputtering of the small electrode.

At a surface ratio $R_{A12}$ of unity and with inventively applying the magnetic field H, $U_{1GND}$ becomes 150V. Thereby, the voltage $U_{pl}$ is 265V, which leads to an accelerating voltage $U_1$ of 115V and to an accelerating voltage $U_2$ of 265V. It may thus be seen that with equal electrode surfaces application of the magnetic field H to that electrode, which shall not be sputtered, leads to the fact that the other electrode is practically exclusively sputtered. Without application of the field H, $U_{1GND}$ becomes 0, $U_{pl}$ about 170V, so that the accelerating voltages $U_1$ and $U_2$ become, equally, about 170V.

At a surface ratio of 1.3, the voltage $U_{1GND}$ becomes 190V and $U_{pl}$ 281V. This leads to an accelerating voltage $U_1$ of about 83V, now to the larger electrode, whereas the accelerating voltage $U_1$ to the smaller electrode is 281V. Thereby it might be seen that sputtering of the larger electrode is practically excluded.

Without inventive application of the magnetic field H, $U_{1GND}$ becomes approximately 150V at a plasma voltage of approximately 260V, which leads to an accelerating voltage at the larger electrode of 110V, by which the larger electrode will considerably be cosputtered with the smaller electrode by the resulting accelerating voltage $U_2$ of approximately 260V.

It is strongly believed that by increasing the strength of magnetic field H, the difference shown in FIG. 9 between applying and not applying field H may be considerably increased, leading to the possibility of exploiting the inventively applied magnetic field up to limits of the surface ratio $R_{A12}$ of 0.3 and 3 respectively.

With the apparatus described, etching rates of above 30 nm/min were achieved for $SiO_2$ layers on an Si-wafer. Etching rates in this order of magnitude could only be achieved heretofore by extremely high RF voltages of 2 KV and pressures of about 1 Pa. The use of such high voltages and high pressures in semiconductor manufacturing represented a real problem, which now appears additionally to be solved by the present invention.

What is claimed is:

1. A process for sputtering a surface of an object, comprising the steps of:
    (a) providing in a vacuum recipient a first and second conductive electrode with a first and a second electrode surface respectively;
    (b) selecting a gas pressure for working gas to be applied to said vacuum recipient;
    (c) confining a discharge space in said recipient defined by said first and second electrode surfaces, thereby preventing an RF discharge generated between said first and second electrode surfaces to spread outside the confined discharge space;
    (d) generating an RF plasma discharge in said discharge space with said working gas at a gas pressure selected during step (b) by applying an electric RF field between said first and second electrode surfaces, thereby generating in said space and adjacent said first electrode surface a first dark space region with a first drop of time-averaged electric potential and adjacent said second electrode surface a second dark space region with a second drop of time-averaged electric potential, said first and second drops of time-averaged electric potential falling towards said first and second electrode surfaces respectively;
    (e) selecting a ratio $R_{A12}$ of areas of said first to second electrode surfaces to be $0.3 \leq R_{A12} < 1$;
    (f) disposing said surface of said object in said second dark space region adjacent said second electrode surface, said second electrode surface being larger than said first electrode surface and said surface of said object facing said first dark space region thereby disposing said surface of said object at one of a floating electric potential and at an electric potential of said second electrode surface, so as to perform diode sputtering; and
    (g) applying a magnetic field within said discharge space to said first electrode to enable sputtering of said surface of said object adjacent said second and large electrode surface, a predominant part of lines of force of the magnetic field having being tunnel shaped on said first electrode surface and across said first dark space region.

2. A process for sputtering a surface of an object, comprising the steps of:
    (a) providing in a vacuum recipient a first and a second conductive electrode with a first and a second electrode surface respectively;
    (b) selecting a gas pressure for working gas to be applied to said vacuum recipient;
    (c) confining a discharge space in said recipient by said first and second electrode surfaces, thereby preventing an RF discharge generated between said first and second electrode surfaces to spread outside said the confined space;
    (d) generating an RF plasma discharge in said discharge space with said working gas at gas pressure selected in step (b) by applying an electric RF field between said first and second electrode surfaces, thereby generating in said space and adjacent said first electrode surface a first dark space region with a first drop of time-averaged electric potential and adjacent said second electrode surface a second dark space region with a second drop of time-averaged electric potential, said first and second drops of time-averaged electric potential falling towards said first and second electrode surfaces respectively; and
    (e) selecting a ratio $R_{A12}$ of areas of said first and second electrode surfaces to be $1 \leq R_{A12} \leq 3$;

(f) disposing said surface of said object in said second dark space region adjacent said second electrode surface, said second electrode surface being smaller than said first electrode surface, said surface of said object facing said first dark space region, thereby disposing said surface of said object at one of a floating electric potential and of an electric potential of said second electrode surface, so as to perform diode sputtering; and
    (g) reducing said first drop of time-averaged electric potential falling towards said first electrode surface, being equal or larger than said second electrode surface, below a value which would lead to substantial sputtering of said first electrode surface, by applying to said first electrode a magnetic field within said discharge space, a predominant part of its lines of force being tunnel-like shaped on said first electrode surface.

3. The process of one of the claims 1 or 2, comprising the step of increasing the plasma density in said dark space region, where across said tunnel-like shaped magnetic field is applied by said magnetic field by a factor of at least ⅓ compared with a density of said plasma therein without said magnetic field.

4. The process of claim 1, further comprising the step of providing a ratio $R_{U21}$ of said drop of time-averaged electric potential across said second dark space region to said drop across said first dark space region by providing a field strength of said magnetic field to obtain a ratio $R_{U21}$ of at least one of $R_{U21} \geq 1$, $R_{U21} \geq 1.4$, $R_{U21} \geq 1.7$.

5. The process of claim 1, further comprising the step of selecting a material of said first electrode surface and adjusting a value of said drop of time-averaged electric potential across said first dark space region, so that sputtering of said material is substantially avoided.

6. The process of claim 2, comprising the step of increasing a ratio $R_{U21}$ of said drop of time-averaged electric potential across said second dark space region to said drop across said first dark space region to be at least one of $R_{U21} \geq 2$, $R_{U21} \geq 2.5$, $R_{U21} \geq 3$.

7. The process of claims 1 or 2, comprising the step of applying a further magnetic field within said discharge space, a predominant part of its lines of force being tunnel-like shaped on said second electrode.

8. The process of claims 1 or 2, comprising the step of selecting a ratio of overall sum of magnetic fluxes taken as absolute values to an overall sum of magnetic fluxes on said first electrode surface to be equal to or greater than 2.

9. The process of claim 1, comprising the step of selecting said ratio $R_{A12}$ to be $$0.5 \leq R_{A12} < 1.$$

10. The process of claim 2, comprising the step of selecting said ratio $R_{A12}$ to be $$1 \leq R_{A12} \leq 2.$$

11. The process of claims 1 or 2, comprising the step of controlling a distribution of sputtering of said surface of said object by increasing plasma density adjacent said surface at selected areas by said magnetic field.

12. An apparatus for sputtering a surface of an object, comprising:
   (a) a vacuum recipient;
   (b) a first and a second conductive electrode with a first and a second electrode surface respectively in said vacuum recipient;
   (c) controlled gas feed means for feeding a gas to said recipient and providing a predetermined gas pressure in said recipient;
   (d) said first and second electrode surfaces being arranged for confining a discharge space within said recipient;
   (e) an RF generator connected to at least one of said first and said second electrodes for generating an RF plasma discharge in said confined discharge space;
   (f) means for preventing said RF plasma discharge from spreading out of said confined discharge space;
   (g) a ratio $R_{A12}$ of an area of said first electrode surface and of an area of said second electrode surface being $$0.3 \leq R_{A12} < 1;$$

(h) holder means for said object adjacent said second electrode surface, said holder means being one of electrically isolated from any other part to which an electric potential is applied, and electrically connected to said second electrode surface, so as to provide a diode sputter apparatus; and
   (i) magnetic field generating means, generating a magnetic field within said discharge space with a predominant part of its lines of force being tunnel-like shaped on said first electrode surface to provide substantial sputtering adjacent said second electrode surface.

13. An apparatus for sputtering a surface of an object, comprising:
   a vacuum recipient;
   a first and a second electrode with a first and a second electrode surface respectively in said vacuum recipient;
   controlled gas feed means to said recipient for feeding a gas to said recipient and installing a predetermined gas pressure in said recipient;
   said first and second electrode surfaces confining a discharge space within said recipient;
   an RF generator connected to at least one of said first and said second electrodes for generating an RF plasma discharge in said confined discharge space;
   means preventing said RF plasma discharge from spreading out of said confined discharge space;
   a ratio $R_{A12}$ of an area of said first electrode surface and an area of said second electrode surface being $$1 \leq R_{A12} \leq 3;$$

holder means for said object adjacent said second electrode surface, said holder means being one of electrically isolated from any other part to which an electric potential is applied and of electrically connected to said second electrode surface, so as to provide for a diode sputter apparatus;
   means for generating a magnetic field on said first element within said discharge space with a predominant portion of lines of force thereof being tunnel shaped on said first electrode surface to substantially reduce sputtering of said first electrode surface.

14. The apparatus of claims 12 or 13, said object being one of a target to be sputtered and of a work-piece to be sputter-etched.

15. The apparatus of claim 12, wherein said ratio is $$0.5 \leq R_{A12} < 1.$$

16. The apparatus of claim 13, wherein said ratio is $$1 \leq R_{A12} \leq 3.$$

17. The apparatus of claims 12 or 13, wherein said magnetic field is applied at a periphery of said first electrode.

18. The apparatus of claims 12 or 13, wherein said magnetic field has a flux adjacent said second electrode which is greater than a flux adjacent to said first electrode.

19. The apparatus of claims 12 or 13, comprising further magnetic field generating means generating a magnetic field within said discharge space with a predominant part of its lines of force being tunnel-like shaped on said second electrode surface to improve plasma density adjacent said second electrode surface.

20. The apparatus of claims 12 or 13, wherein a ratio of an overall sum of magnetic fluxes taken as absolute values to an overall sum of magnetic fluxes on said first electrode surface is larger than or equal to 2.

21. A process for sputtering a surface of an object, comprising:
   providing first and second conductive electrodes opposing each other, said first and second electrodes having respective first and second electrode surfaces with first and second electrode surface areas which together form at least two sides of a confining chamber, said confining chamber forming a confined discharge space, said confined discharge space being sufficiently confined to prevent positive ions produced by an RF discharge generated between said first and second electrode surfaces from spreading outside of said confined discharge space, said confined discharge space being devoid of any other electrodes used to cause sputtering, a ratio of one to another of said first and second electrode surface areas being no smaller than 0.3 and no larger than 3;
   applying a alternating current RF voltage, with no DC bias, to at least one of said first and second electrodes in order to provide a resulting alternating current RF voltage between said first and second electrodes, thereby generating in said confined discharge space and adjacent said first electrode surface a first dark space region with a first time-averaged electric potential, dropping by a first voltage drop as said first time-averaged electric potential approaches said first electrode surface, and generating in said confined discharge space and adjacent said second electrode surface a second dark space region with a second time-averaged electric potential, dropping by a second voltage drop as said second time-averaged electric potential approaches said second electrode surface;

positioning an object to be sputtered adjacent said first electrode surface; and providing a ratio of a sputtering rate occurring at said first electrode surface to a sputtering rate occurring at said second electrode surface, which ratio is obtained by intersecting said confined discharge space with an applied magnetic field, at least half of the total flux of said applied magnetic field which intersects said discharge space forming a loop out of and back into said second electrode surface while not intersecting with said object to be sputtered, said applied magnetic field providing a ratio of said first voltage drop to said second voltage drop in which the first voltage drop is increased relative to said second voltage drop as compared with a ratio of a first voltage drop to a second voltage drop when a magnetic field is not present.

22. A process according to claim 1, wherein the magnetic field applied in step (g) is a DC magnetic field.

23. An apparatus according to claim 12, wherein the magnetic field generating means is configured to generate a DC magnetic field.

24. An apparatus according to claim 13, wherein the magnetic field generating means is configured to generate a DC magnetic field.

25. A process according to claim 21, wherein the applied magnetic field intersecting said confined discharge space is a DC magnetic field.

* * * * *